(12) United States Patent
Tseng et al.

(10) Patent No.: US 7,781,140 B2
(45) Date of Patent: Aug. 24, 2010

(54) METHOD OF FINE PITCH BUMP STRIPPING

(75) Inventors: Chih-Min Tseng, Hsinchu County (TW); Hsiu-Mei Yu, HsinChu (TW); Wen-Hsiang Tseng, Hsinchu (TW); Chia-Jen Cheng, Taoyuan (TW); Yu-Lung Feng, Chubei (TW); Tung-Wen Hsieh, Miaoli County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 548 days.

(21) Appl. No.: 11/465,375

(22) Filed: Aug. 17, 2006

(65) Prior Publication Data

US 2008/0044756 A1 Feb. 21, 2008

(51) Int. Cl.
*G03F 7/42* (2006.01)
*B08B 3/08* (2006.01)
*B08B 3/10* (2006.01)

(52) U.S. Cl. .............................. 430/258; 134/1; 134/26; 134/33

(58) Field of Classification Search .............. 430/270.1, 430/259, 258, 260, 329; 134/2, 1.3, 33, 138, 134/32, 3, 18, 22.15, 26, 36; 438/704, 707
See application file for complete search history.

(56) References Cited

U.S. PATENT DOCUMENTS

| | | | | |
|---|---|---|---|---|
| 3,998,653 A | * | 12/1976 | Anthony et al. ................. | 134/1 |
| 5,227,001 A | * | 7/1993 | Tamaki et al. ........... | 156/345.22 |
| 5,370,142 A | * | 12/1994 | Nishi et al. .................... | 134/61 |
| 5,803,340 A | * | 9/1998 | Yeh et al. .................... | 228/56.3 |
| 5,863,348 A | * | 1/1999 | Smith et al. .................... | 134/18 |
| 5,904,156 A | * | 5/1999 | Advocate et al. ............... | 134/2 |
| 6,911,097 B1 | | 6/2005 | Chen et al. | |
| 6,927,176 B2 | * | 8/2005 | Verhaverbeke et al. ...... | 438/745 |
| 6,951,823 B2 | | 10/2005 | Waldfried et al. | |
| 2002/0166569 A1 | * | 11/2002 | Harvey et al. ................. | 134/1.3 |
| 2004/0206378 A1 | * | 10/2004 | Okuda et al. ............... | 134/56 R |
| 2006/0076034 A1 | * | 4/2006 | Nam et al. ..................... | 134/2 |

\* cited by examiner

*Primary Examiner*—Cynthia H Kelly
*Assistant Examiner*—Anca Eoff
(74) *Attorney, Agent, or Firm*—Duane Morris LLP

(57) ABSTRACT

A method for removing dry film resist (DFR) from a fine pitch solder bump array on a semiconductor wafer provides for pre-soaking the wafer in a chemical bath then turbulently exposing the wafer to a chemical solution, both steps taking place in batch processing with the wafers processed in a vertical position. The wafers are then individually processed through a chemical spinning operation in which a chemical solution is dispensed from a spray nozzle while motion such as spinning is imparted the horizontally disposed wafer. The spin speed of the chemical spraying process may then be increased to accelerate physical removal of residue. Deionized water rinsing and spin-drying provide a solder bump array void of any DFR or other residuals.

20 Claims, 4 Drawing Sheets

METHOD OF FINE PITCH BUMP STRIPPING

FIELD OF THE INVENTION

Aspects of the present invention relate, most generally, to semiconductor device manufacturing and more specifically to cleaning methods for removing dry film resist (DFR) from fine-pitch solder bumps formed on a semiconductor wafer.

BACKGROUND

In the semiconductor manufacturing industry, fabrication of integrated circuits on a semiconductor wafer involve a number of steps in which patterns are formed in a film of photosensitive resist, i.e. a photoresist, formed on the wafer. With the patterned formed, and void areas within the photoresist film, subsequent processing operations such as implantation of impurities, oxidation, etching and metallization may be performed. Once an integrated circuit is completely formed on a semiconductor wafer, the wafer is next assembled into a package. Solder bumps are typically formed on the topside of a wafer after a passivation coating has been applied to the integrated circuit formed on the opposite side of the same wafer. A favored method for forming solder bumps on a wafer's surface includes the use of a dry film photoresist, also referred to as a dry film resist (DFR) that is typically part of a composite layer including a carrier film and cover film. The DFR is a negative-type photoresist or photosensitive resin. After a solder bump pattern is formed in the DFR using exposure and developing methods, solder is electroplated into the void areas of the pattern. Before the solder can be reflowed, the DFR must be removed. The ability to completely strip the DFR depends on chemical characteristics but also physical effects especially when the solder bump array includes a fine pitch and a high aspect ratio is therefore present.

From a chemical reaction point of view, conventional methods for chemically stripping the DFR have low reaction rates due to the low collision frequency between the chemical stripper and the dry film photoresist molecules. Furthermore, from a thermodynamic point of view, the activation energy of photoresist molecules dissolving into the chemical stripper is intensified under static conditions, thus resulting in residues left on the wafers in view of the fact that an incomplete chemical reaction takes place in a limited processing time. Conventional processing suffers the risk of redepositing the dissolved impurities back onto the wafer in a viscous static chemical stripper solution due to the low solubility of the photoresist.

Conventional methods for attempting to strip DFR from wafers typically involve one or more chemical baths in which are placed cassettes or other carriers filled with a plurality of photoresist coated wafers, i.e., batch processing is used. A DFR pre-soak is carried out in a first tank and a second tank provides heating and agitation functions to strip clear any unremoved DFR and other residuals. The processing in the two tanks is then followed by further batch processing in a QDR (Quick Dump Rinse) chemical bath to clean the remaining chemicals and an IPA (isopropyl alcohol) dryer tank to dry the wafers.

The chemical stripping operations carried out in chemical baths have been found to be largely ineffective for removing DFR especially when fine-pitch bump solder arrays are used, for example arrays in which the bump to bump pitch is less than 175 microns. Other approaches for batch processing the wafers through multiple operations include the necessity for adding additional chemical baths because the chemical bath approach for stripping DFR particularly in fine pitch bump arrays, is generally insufficient.

The present invention addresses these shortcomings.

SUMMARY OF THE INVENTION

The present invention provides a method for removing photoresist from a wafer. The method comprises pre-soaking the wafer in a chemical bath, turbulently exposing the wafer to a chemical solution and a chemical bath while the wafer is disposed in a cassette, spraying the wafer with a further chemical solution while providing motion to the wafer and rinsing the wafer with DI water.

In another aspect, the invention provides a method for removing photoresist from a substrate comprising presoaking the substrate in a chemical bath, turbulently exposing the substrate to a chemical solution in the chemical bath while the substrate is within a carrier, spraying the substrate with the chemical solution or a further chemical solution, scouring the substrate using the chemical solution or the further chemical solution, and rinsing the substrate in deionized water. The presoaking, turbulently exposing, spraying, scouring and rinsing each take place in the same tool and in more than one processing station of the tool.

In another aspect, the invention provides a method for removing DFR (dry film resist) from a substrate comprising providing a substrate with a solder bump array on a surface thereof, the DFR adhering to the surface between solder bumps of the solder bump array. The method further provides chemically separating the DFR from adhering to the surface in a first process sequence, resulting in residuals remaining to physically contact the surface and the solder bumps; and physically removing the residuals in a second process sequence

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

One aspect of the present invention provides a method for cleaning photoresist from a semiconductor substrate or wafer. The method of the present invention may be used to remove photoresist from the front side of a semiconductor wafer, i.e. the side upon which the integrated circuit or other device is being formed. The method of the invention may also be used to remove photoresist such as DFR from the backside of a semiconductor or other substrate such as a package substrate, upon which an array of solder bumps is formed. Although the illustrations in FIGS. 2A-2F show the backside of a wafer and DFR being removed from the backside, it should be understood that this is exemplary only.

Figure 1:
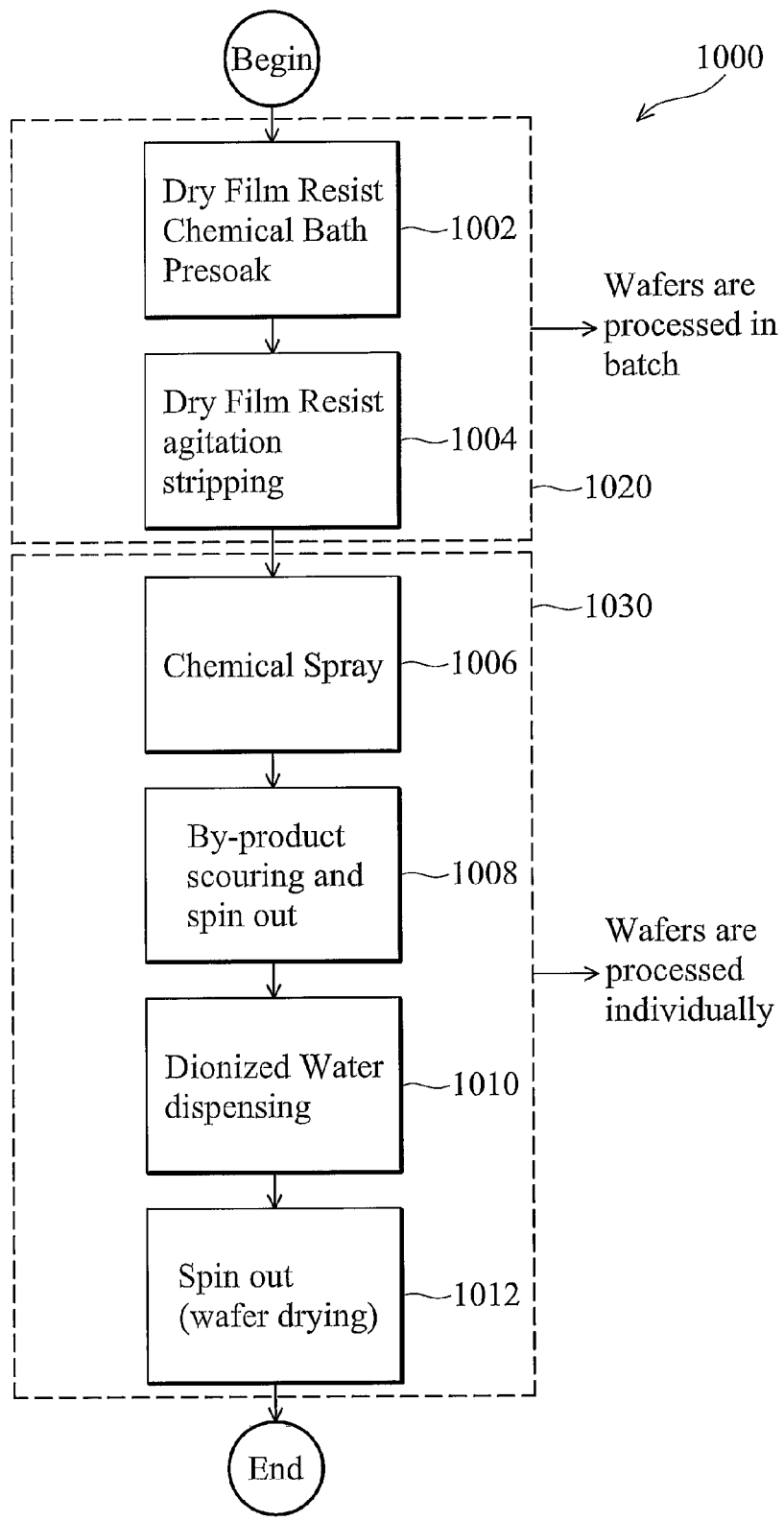
FIG. 1 is a flow chart illustrating a sequence of a wafer cleaning process according to the invention.

FIG. 1 is a flow chart showing a wafer cleaning procedure for removing dry film photoresist or other photoresist from a wafer or other substrate, conducted and operative in accordance with the embodiments of the present invention. Process 1000 of FIG. 1 is suitably described in conjunction with the graphical illustrations of FIGS. 2A-2F. Broadly stated, the method includes batch processing (block 1020) the wafers according to batch processing in one or more chemical baths to pre-soak then agitate the wafers, then individually processing (block 1030) each wafer through a chemical spray operation in which the wafer is individually spun and sprayed, then rinsing and drying the wafer.

Referring both to FIGS. 1 and 2A-2F, the operations of blocks 1002 and 1004 are carried out using batch processing 1020 techniques. That is, the wafers are loaded in a wafer cassette or other carrier and simultaneously processed through the operations. A wafer including the configuration shown in FIG. 2A may be first processed in a dry film resist chemical bath pre-soak as in block 1002 shown in FIG. 1.

Figure 2A:
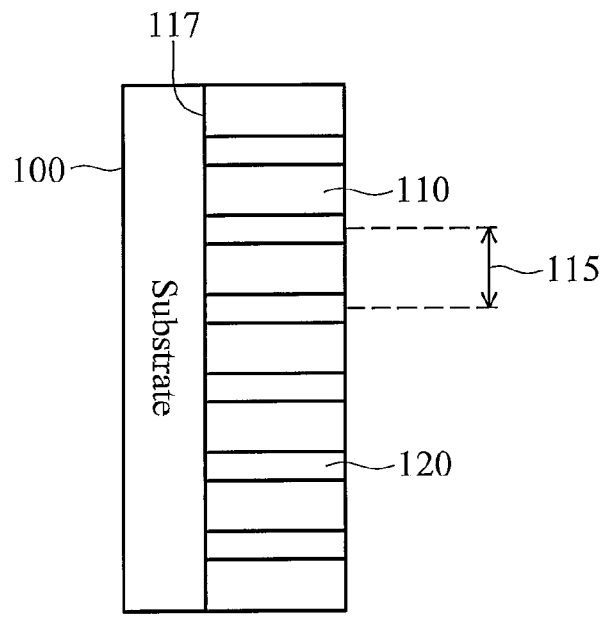
FIGS. 2A-2F are cross sectional views graphically illustrating the wafer cleaning procedure in accordance with an embodiment of the present invention.

FIG. 2A shows substrate 100 which may be a silicon or other semiconductor wafer including surface 117 upon which solder bumps 120 and DFR (Dry Film Resist) 110 are disposed. Generally flat substrate 100 is shown in essentially vertical position and this position represents the orientation in which substrate 100, secured in a carrier, is processed at block 1002. Pitch 115 between solder bumps 120 may be on the order of 175 microns or less but the invention may equally effective in cleaning substrates with solder bump arrays having wider pitches or photoresist or DFR used in other applications. DFR 110 may be any of various commercially available negative photoresists used as DFR in such applications. In one exemplary embodiment, wafer 100 may additionally include a separator sheet and coating sheet such as PET, polyester, in addition to DFR 110. Conventional methods may be used to coat DFR 110 and any additional films, pattern the film(s) and evaporate or otherwise deposit solder as solder bumps 120.

Figure 2B:
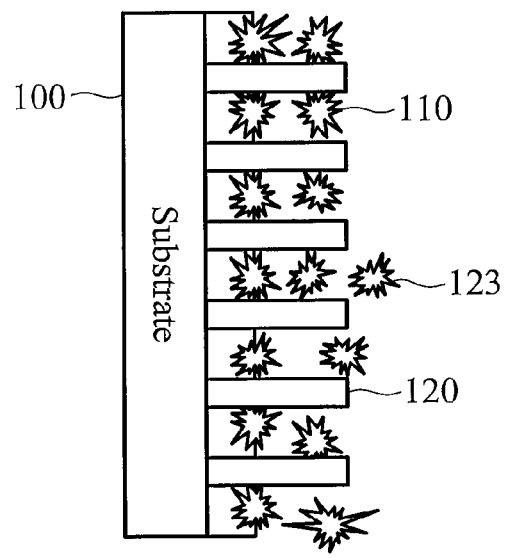

The substrate of FIG. 2A is pre-soaked in a chemical bath, i.e. block 1002 of FIG. 1, resulting in the structure shown in FIG. 2B. In advantageous embodiments, substrate 100 is a semiconductor wafer of various sizes, placed in a cassette or other carrier. The peripheral edges of the wafer may be supported on the cassette which is submerged in the chemical bath. At block 1002, the substrate, advantageously in a cassette or other carrier is pre-soaked simultaneously with other substrates in the same carrier, in the static chemical solution within a chemical bath. The bath may advantageously be a SUS (stainless) tank with automatic open/close cover used to prevent solvent solutions from evaporating thereby maintaining chemical activity within the solvent. The chemical solvents may be primarily organic in nature and vary from slightly to highly alkaline. Hydroxyl amine based chemistries exhibit good polymer removal/cleaning performances and are used at relatively high temperatures and with processing times that may vary from 15-45 minutes. Semi-aqueous fluoride based cleaning chemistries may also be used at lower temperatures such as room temperature. In one exemplary embodiment, the chemical solution may be Dynastrip 7000 T, composed of glycol ether family 90%, potassium hydroxide 5%. In another exemplary embodiment, the chemical solvent may be SPS-200 which is composed of dimethyl selfoxide (DMSO) 96% and tetramethylamonium hydroxide 4%. In other exemplary embodiments, other suitable chemical solvents may be used.

FIG. 2B shows substrate 100 after the chemical bath pre-soak operation of block 1002 in which the majority of DFR 110 is removed from directly adhering, as a film, to surface 117, but a plurality of residuals 123 still remain.

At block 1004, agitation or other motion that turbulently exposes the substrates to the chemical solution is provided. Blocks 1002 and 1004 may take place in the same or a different chemical bath and therefore may use the same or a different chemical solution, described previously. The turbulence may be provided by mechanically agitating the chemical solution, the cassette and/or the substrates. The turbulence may be provided by periodically striking the cassette or the substrate to provide motion. In another exemplary embodiment, ultrasonic waves may be propagated through the solution. In another exemplary embodiment, mechanical motion may be provided such as by a liner motor (LM) guild to move a wafer carrier holder to provide back-and-forth lateral or other motion to the cassette and thereby also the substrates.

Figure 2C:
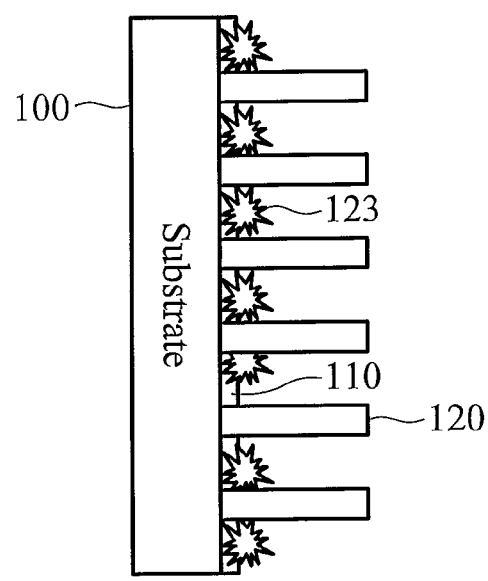

FIG. 2C shows a further progression of the structure shown in FIG. 2B may appear after the agitation step of block 1004. It can be seen that there are fewer residuals 123. The agitation or other turbulence loosens dry film resist 110 stuck between solder bumps 120 or other portions of substrate 100 but many residuals 123 still remain in physical contact with substrate 100 due to static or other forces.

Figure 2D:
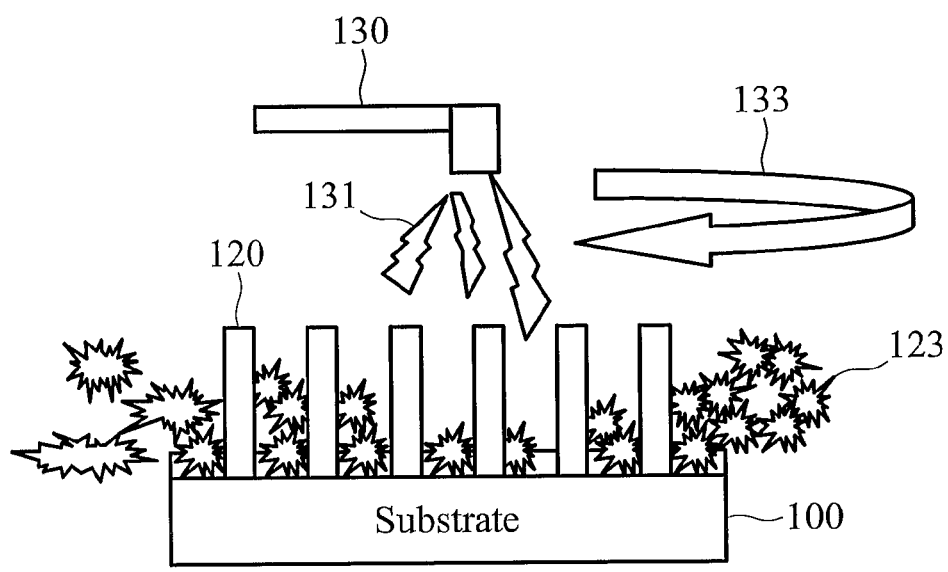

After the dry film resist agitation stripping step of block 1004, the substrates are next processed in block 1030 through the operations of blocks 1006, 1008, 1010 and 1012, as individual substrates. During the operations of blocks 1002 and 1004, the substrates are generally positioned vertically for processing as illustrated in FIGS. 2A-2C and when individually processed through the operations represented by blocks 1006, 1008, 1010 and 1012, the substrates are maintained generally horizontally such as shown in FIG. 2D which illustrates the substrate during the chemical spray operation of block 1006. In block 1006, substrate 100 is then subject to chemical spray and spinning as shown in FIG. 2D. Spray nozzle 130 dispenses chemical solution 131 onto substrate 100. Arrow 133 represents substrate 100 spinning. Substrate 100 may rest on any of various suitable chucks for maintaining a substrate and spinning the same while a spray nozzle sprays a chemical solution on substrate 100. Various spin speeds and flow rates of chemical solution 131 out of spray nozzle 130, may be used. Chemical solution 131 may be any of the previously described chemical solutions and it may be the same or different than the chemical solutions used for processing in blocks 1002 and 1004. According to one exemplary embodiment, the operations of each of blocks 1002-1012 may take place in the same piece of equipment, i.e., processing tool, and the substrates may be automatically transported from being in a vertical position in a carrier in steps represented by blocks 1002 and 1004, to horizontally disposed, individually processed substrates as in the steps represented by blocks 1006-1012.

In block 1008, scouring of the substrate surface may take place. During scouring, chemicals reach deep into the trenches formed between solder bumps 120, reaching the bottom area of the trenches, through pressure dispense methodology which accelerates chemical reactions and renders DFR or PR by-products easy to physically remove by spinning effect. Conventional bath processing is limited to chemical reactions occurring only due to chemical convection in which the chemical reaction with DFR, PR or by-products, occurs very slowly. Returning to the process of block 1008, additional chemical solution is dispensed and the substrate spinning continues. In one exemplary embodiment, the spin speed may be increased to produce a more turbulent condition on the substrate surface and to physically remove, through centrifugal or other mechanical forces and at an accelerated rate, additional residuals 123 that may have previously been chemically removed from adhering to the surface. At block 1008, the same or a different chemical solution as was used during the processing represented by block 1006, may be used.

Figure 2E:
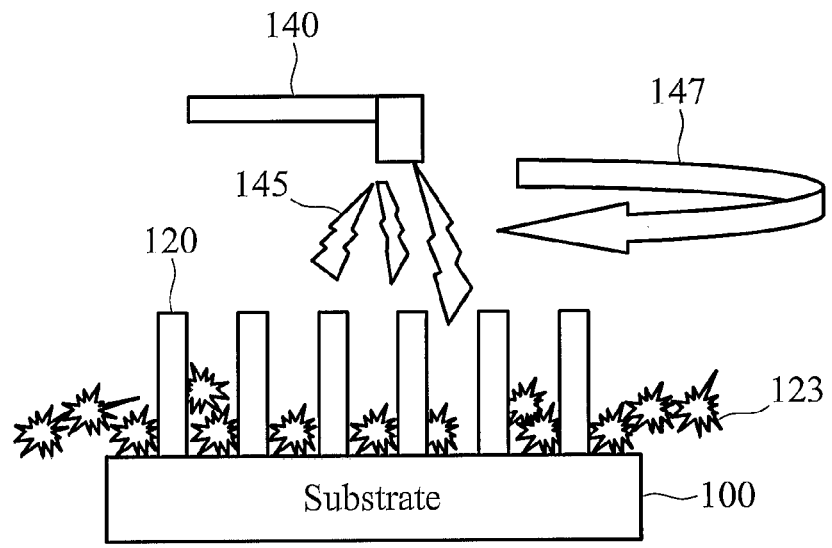
Figure 2F:
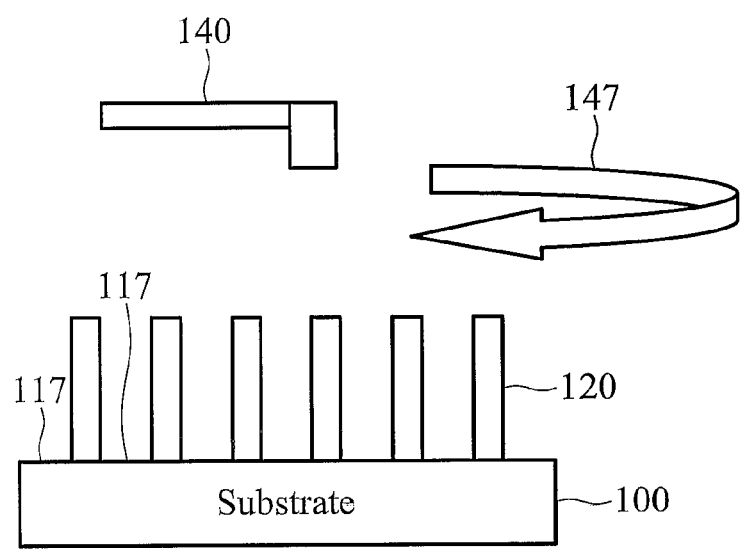

Referring to FIGS. 2E and block 1010 of FIG. 1, residuals 123 represent particles of DFR or other residuals that have been chemically removed but are still physically positioned between solder bumps 120. At block 1010, dionized water 145 is dispensed from water nozzle 140 as substrate 100, individually processed and horizontally disposed, is rotated as represented by arrow 147. Various DI water flow rates spin speeds and processing times may be used. Eventually, all of the dislodged residuals 123 are physically removed by the rinsing operation to produce substrate 100 shown in FIG. 2F.

In the spin out (wafer drying) step represented by block 1012, water nozzle 140 is turned off and substrate 100 is rotated, indicated by arrow 147, at a suitable spin speed and for a sufficient length of time to completely dry substrate 100. Substrate 100 shown in FIG. 2F includes surface 117 substantially free of DFR, or other residuals. Solder bumps 120 may then be subsequently processed according to conventional methods.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for removing photoresist from a substrate, comprising:
   presoaking said substrate in a chemical bath;
   turbulently exposing said substrate to a chemical solution in said chemical bath while said substrate is disposed in a carrier and oriented in a first orientation;
   spraying said substrate with a further chemical solution while spinning said substrate individually with said substrate oriented in a second orientation and not disposed in said carrier or a further carrier; and
   rinsing said substrate with DI (deionized) water,
   said first orientation being different than said second orientation.

2. The method as in claim 1, wherein said first orientation is vertical and said substrate is processed together with a plurality of further substrates in said carrier during said presoaking and said turbulently exposing.

3. The method as in claim 2, wherein said second orientation is horizontal and said substrate is processed individually and not in said carrier or a further carrier, during said rinsing.

4. The method as in claim 1, wherein each of said presoaking, turbulently exposing, spraying and rinsing are carried out automatically, in-situ in a single processing tool.

5. The method as in claim 4, wherein said first orientation is vertical and second orientation is horizontal and further comprising said processing tool transferring said substrate from being in said vertical orientation in said carrier in said chemical bath to said horizontal orientation and positioned on a chuck in a spraying chamber for said spraying.

6. The method as in claim 1, further comprising providing said substrate having a surface with a plurality of solder bumps thereon and with said photoresist between said solder bumps and wherein said presoaking, turbulently exposing, spraying and rinsing remove said photoresist from said substrate, said photoresist being a negative-type dry film resist.

7. The method as in claim 1, wherein said chemical solution comprises an alkaline mixture.

8. The method as in claim 1, wherein said first orientation is orthogonal to said second orientation.

9. The method as in claim 1, wherein said carrier further retains a plurality of further substrates, said presoaking and said turbulently exposing each comprising simultaneously processing said substrate and said plurality of further substrates.

10. The method as in claim 1, wherein said turbulently exposing comprises agitating at least one of said carrier and said substrate.

11. The method as in claim 1, wherein said turbulently exposing comprises agitating said chemical solution.

12. The method as in claim 1, wherein said turbulently exposing comprises introducing ultrasonic waves to said chemical solution.

13. The method as in claim 1, wherein said turbulently exposing comprises periodically striking said carrier or said substrate.

14. The method as in claim 1, wherein said spinning takes place after said presoaking.

15. The method as in claim 1, further comprises scouring said substrate with said chemical solution.

16. The method as in claim 15, wherein said spraying takes place in a processing chamber and said scouring further takes place in said processing chamber.

17. A method for removing photoresist from a substrate comprising:
    presoaking said substrate in a chemical bath;
    turbulently exposing said substrate to a chemical solution in said chemical bath while said substrate is disposed vertically within a carrier;
    spraying said substrate with said chemical solution or a further chemical solution;
    scouring said substrate using said chemical solution or said further chemical solution; and
    rinsing said substrate in deionized water,
    wherein said presoaking, turbulently exposing, spraying, scouring and rinsing each take place in the same tool and in more than one processing station of said tool and said substrate is processed individually and oriented horizontally during said spraying and scouring.

18. A method for removing DFR (dry film resist) from a substrate comprising:
   providing said substrate with a solder bump array on a surface thereof and said DFR adhering to said surface between solder bumps of said solder bump array;
   chemically separating said DFR from adhering to said surface in a first batch process sequence in which said substrate is retained vertically and resulting in residuals remaining that physically contact said surface and said solder bumps; and
   physically removing said residuals in a second process sequence in which said substrate is positioned horizontally, wherein said chemically separating and said physically removing are carried out in-situ, in the same processing tool.

19. The method as in claim 18 wherein said first process sequence comprises:
   presoaking said substrate in a chemical bath while said substrate is disposed in a carrier, and
   turbulently exposing said substrate to a chemical solution in said chemical bath while said substrate is disposed in said carrier; and
   wherein said second process sequence comprises:
   spraying said substrate with a further chemical solution while spinning said substrate individually, and
   rinsing said substrate with DI (deionized) water while spinning said substrate individually.

20. The method as in claim 18, wherein said physically removing comprises processing said substrate individually.

* * * * *